United States Patent
Hwang et al.

(10) Patent No.: US 9,525,030 B2
(45) Date of Patent: Dec. 20, 2016

(54) SEMICONDUCTOR DEVICE AND METHOD FOR GROWING SEMICONDUCTOR CRYSTAL

(75) Inventors: Min Young Hwang, Seoul (KR); Seok Min Kang, Seoul (KR); Moo Seong Kim, Seoul (KR); Yeong Deuk Jo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/128,967

(22) PCT Filed: Jun. 13, 2012

(86) PCT No.: PCT/KR2012/004674
§ 371 (c)(1),
(2), (4) Date: Dec. 23, 2013

(87) PCT Pub. No.: WO2012/177014
PCT Pub. Date: Dec. 27, 2012

(65) Prior Publication Data
US 2014/0131736 A1  May 15, 2014

(30) Foreign Application Priority Data

Jun. 23, 2011 (KR) .................. 10-2011-0061397
Oct. 24, 2011 (KR) .................. 10-2011-0109021

(51) Int. Cl.
*H01L 29/15* (2006.01)
*H01L 29/16* (2006.01)
*H01L 21/02* (2006.01)

(52) U.S. Cl.
CPC ....... *H01L 29/1608* (2013.01); *H01L 21/0243* (2013.01); *H01L 21/02378* (2013.01); *H01L 21/02639* (2013.01); *H01L 21/02647* (2013.01)

(58) Field of Classification Search
CPC .................. H01L 29/1608; H01L 21/02378
(Continued)

(56) References Cited

U.S. PATENT DOCUMENTS 6,191,007 B1 * 2/2001 Matsui et al. ............... 438/459
7,683,386 B2 * 3/2010 Tanaka et al. ................ 257/88
(Continued)

FOREIGN PATENT DOCUMENTS

| KR | 10-2007-0109695 A | 11/2007 |
|---|---|---|
| KR | 10-2008-0006207 A | 1/2008 |
| KR | 10-2008-0088915 A | 10/2008 |
| KR | 10-2010-0034332 A | 4/2010 |
| WO | WO-2012-102539 A2 | 8/2012 |

OTHER PUBLICATIONS

International Search Report in International Application No. PCT/KR2012/004674, filed Jun. 13, 2012.
(Continued)

*Primary Examiner* — Marc Armand
*Assistant Examiner* — Sarah Salerno
(74) *Attorney, Agent, or Firm* — Saliwanchik, Lloyd & Eisenschenk

(57) ABSTRACT

A semiconductor device according to the embodiment comprises a base substrate; patterns on the base substrate; and an epitaxial layer on the base substrate, wherein the epitaxial layer is formed on a surface of the substrate exposed among the patterns. A method for growing a semiconductor crystal comprises the steps of cleaning a silicon carbide substrate; forming patterns on the silicon carbide substrate; and forming an epitaxial layer on the silicon carbide substrate.

9 Claims, 5 Drawing Sheets

(58) Field of Classification Search
USPC .................................. 257/77; 438/481, 787
See application file for complete search history.

(56) References Cited

U.S. PATENT DOCUMENTS

2004/0232428 A1* 11/2004 Senda .................. H01L 33/007
257/79
2007/0224784 A1 9/2007 Soloviev et al.
2010/0012976 A1* 1/2010 Hydrick et al. .............. 257/190

OTHER PUBLICATIONS

European Search Report in European Application No. 20120802555.
Gyu-Chul Yi, et al, "Direct epitaxial growth of submicron-patterned SiC structures on Si(001)", *Journal of Vacuum Science & Technology B (Microelectronics and Nanometer Structures)*, Nov. 1999, pp. 2600-2602, vol. 17, No. 6, XP002731339.
Hongbo Yu, et al, "Fabrication and optical properties of nano-structured semipolar InGaN/GaN quantum wells on c-plane GaN template", *Physica Status Solidi ©*, May 1, 2008, pp. 1618-1620, vol. 5, No. 6, XP055066066.
Jung-Joon Ahn, et al, "Crystallographic plane-orientation dependent atomic force microscopy-based local oxidation of silicon carbide", *Nano Scale Research Letters Springer-Verlag USA*, Mar. 18, 2011, pp. 1-5, vol. 6, XP055147617.
Xie Xn, et al, "Probe-induced native oxide decomposition and localized oxidation on 6H-SiC (0001) surface: An atomic force microscopy investigation", *Journal of the American Chemical Society 20040623 American Chemical Society US*, Jun. 23, 2004, pp. 7665-7675, vol. 126, No. 24, XP055147627.

* cited by examiner

SEMICONDUCTOR DEVICE AND METHOD FOR GROWING SEMICONDUCTOR CRYSTAL

CROSS-REFERENCE TO RELATED APPLICATIONS

This application is the U.S. national stage application of International Patent Application No. PCT/KR2012/004674, filed Jun. 13, 2012, which claims priority to Korean Application Nos. 10-2011-0061397, filed Jun. 23, 2011, and 102011-0109021, filed Oct. 24, 2011, the disclosures of each of which are incorporated herein by reference in their entirety.

TECHNICAL FIELD

The disclosure relates to a semiconductor device and a method for growing a semiconductor crystal.

BACKGROUND ART

The most important subject in studies for improving the efficiency and characteristic of a semiconductor device is to reduce the crystal defect of a semiconductor layer grown on a substrate and to improve crystallinity of the semiconductor layer.

However, a base substrate comprising silicon carbide may have various defects, such as a defect created in a basal plane of a lattice, a defect caused by the tilting of the lattice, and a defect created on a surface of the base substrate. These defects may exert bad influence upon the semiconductor device when an epitaxial layer is grown. In addition, these defects may exert bad influence upon the operation of a switching device.

In particular, the base substrate comprising silicon carbide may have the basal plane dislocation (BPD). Since the BPD exerts great influence upon the reliability of the semiconductor device, it is very important to reduce the BPD.

According to the related art, a buffer layer is formed in order to reduce the BPD during the crystal growth process. Thus, a mask forming process, a pattern forming process through etching, and a regrowing process are additionally necessary to form the buffer layer.

Due to the above additional processes, the manufacturing process is complicated, the manufacturing cost is increased, and the quality of a substrate surface is deteriorated.

Accordingly, there is necessary to provide a semiconductor device capable of controlling the BPD of the base substrate without forming the buffer layer and a method for growing a semiconductor crystal.

DISCLOSURE OF INVENTION

Technical Problem

The embodiment provides a semiconductor device capable of reducing the manufacturing cost while improving the quality of a substrate surface and a method for growing a semiconductor crystal with a high efficiency.

Solution to Problem

A semiconductor device according to the embodiment comprises a base substrate; patterns on the base substrate; and an epitaxial layer on the base substrate, wherein the epitaxial layer is formed on a surface of the substrate exposed among the patterns.

A method for growing a semiconductor crystal comprises the steps of cleaning a silicon carbide substrate; forming patterns on the silicon carbide substrate; and forming an epitaxial layer on the silicon carbide substrate.

Advantageous Effects of Invention

According to the semiconductor device of the embodiment, micro patterns or grooves are formed on a silicon carbide substrate such that the patterns having a predetermined shape, height and depth can be formed on the silicon carbide substrate. The dislocation can be restrained due to the patterns. In particular, the basal plane dislocation (BPD) of the silicon carbide substrate may exert great influence upon the reliability of the semiconductor device. Since the patterns are formed on the silicon carbide substrate, the BPD can be prevented so that an epitaxial layer having the high quality can be obtained.

Therefore, the buffer layer used for restraining the dislocation may not be necessary, so that the additional processes, such as the patterning process or the regrowing process to form the buffer layer, may be omitted. Thus, the manufacturing cost and the manufacturing time can be reduced and the manufacturing efficiency can be improved.

Meanwhile, according to the method for growing the semiconductor crystal of the embodiment, the micro patterns are formed by using the atomic force microscope (AFM) or grooves are formed on the base substrate by removing an oxide layer pattern, which is formed by using the AFM, so that the patterns having the predetermined interval and depth can be formed.

Therefore, the patterns can be readily formed, so that the manufacturing cost can be reduced. In addition, since the additional processes for forming the buffer layer can be omitted, the damage to the substrate surface can be reduced, so that the crystallinity of the semiconductor layer can be improved. Thus, the semiconductor layer having the high reliability and superior quality can be obtained.

MODE FOR THE INVENTION

Figure 1:
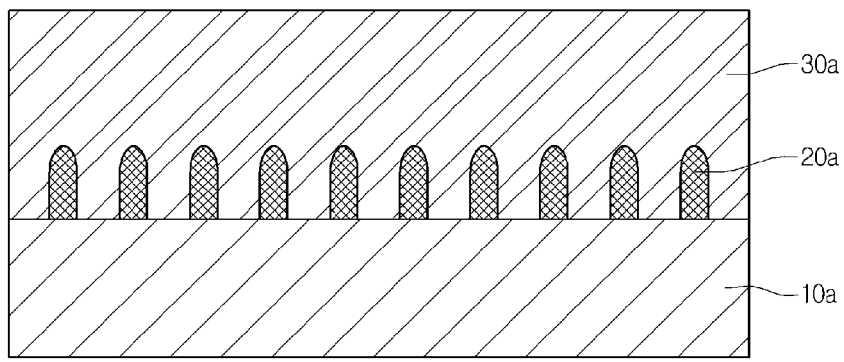
FIG. 1 is a sectional view showing a semiconductor device according to the first embodiment.

In the description of the embodiments, it will be understood that, when a layer (film), a region, a pattern or a structure is referred to as being "on" or "under" another layer (film), another region, another pattern or another structure, it can be "directly" or "indirectly" on the other layer (film), region, pattern, or structure, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

Hereinafter, exemplary embodiments will be described in detail with reference to accompanying drawings.

FIGS. 1 to 4 show a semiconductor device according to the first and second embodiments.

Figure 2:
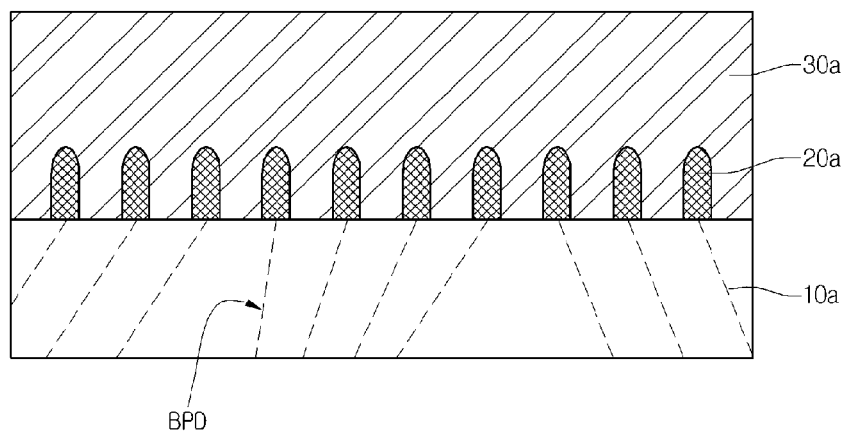
FIG. 2 is a sectional view schematically showing a dislocation behavior in a semiconductor device according to the first embodiment.
Figure 3:
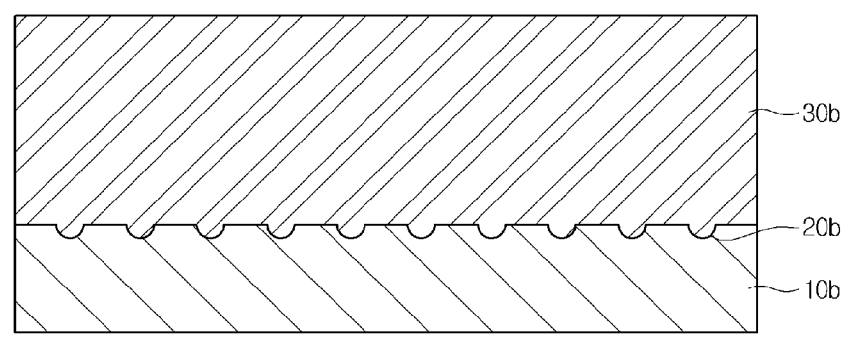
FIG. 3 is a sectional view showing a semiconductor device according to the second embodiment.
Figure 4:
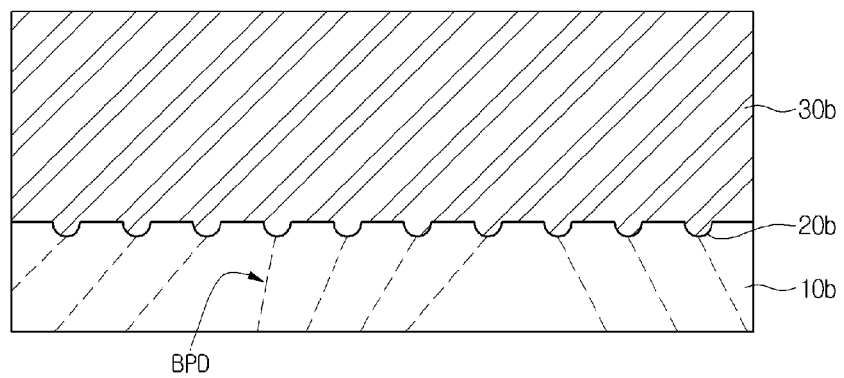
FIG. 4 is a sectional view schematically showing a dislocation behavior in a semiconductor device according to the second embodiment.
Figure 5:
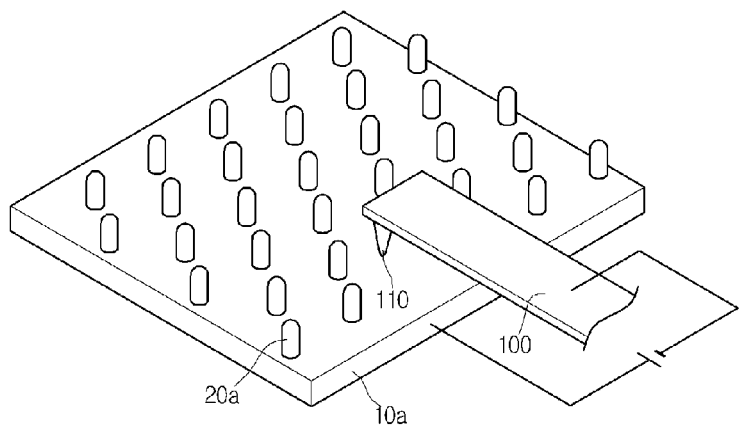
FIGS. 5 to 10 are sectional views showing a method for growing a semiconductor crystal according to the first embodiment.
Figure 6:
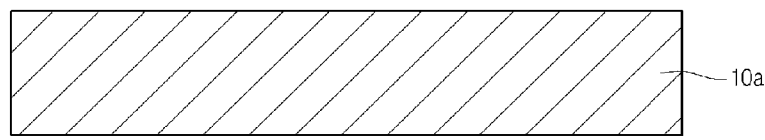
Figure 7:
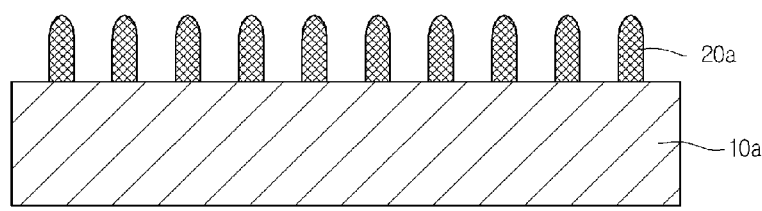
Figure 8:
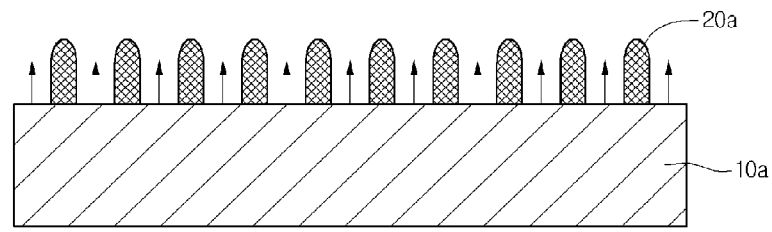

FIG. 1 is a sectional view showing the semiconductor device according to the first embodiment, FIG. 2 is a sectional view schematically showing a dislocation behavior in the semiconductor device according to the first embodiment, FIG. 3 is a sectional view showing the semiconductor device according to the second embodiment, and FIG. 4 is a sectional view schematically showing a dislocation behavior in the semiconductor device according to the second embodiment.

Referring to FIGS. 1 to 4, the semiconductor devices according to the first and second embodiments may comprise base substrates 10a and 10b, patterns 20a and 20b, and epitaxial layers 30a and 30b, respectively.

The base substrates 10a and 10b comprise silicon carbide. The silicon carbide has the bandgap and thermal conductivity higher than those of silicon. In addition, the carrier mobility of the silicon carbide is similar to that of the silicon. Further, the silicon carbide has the high saturated drift velocity and high resisting pressure, so the silicon carbide is employed in the semiconductor device having the high efficiency, high resisting pressure and large size.

The patterns 20a and 20b can be formed on the base substrates 10a and 10b.

The patterns 20a and 20b vertically protrude from the base substrate 10a or can be formed on the base substrate 10b by forming grooves on the base substrate 10b.

Referring to FIGS. 1 and 2, the pattern 20a of the semiconductor device according to the first embodiment vertically protrudes from the base substrate 10a. For instance, the pattern 20a may have an elliptic conical shape.

The long axis of the elliptic cone has a length in the range of 10 nm to 300 nm and a height of 100 nm or less. If the long axis of the elliptic cone exceeds 300 nm, the patterns 20a may be conglomerated with each other and the epitaxial layer 30a may not be grown. However, the embodiment is not limited thereto. The shape and the size of the patterns 20a and the interval between the patterns 20a may vary depending on the distribution of defects in the base substrate 10a.

The pattern 20a may comprise an oxide. In detail, the pattern 20a may comprise carbon oxide or silicon oxide.

In addition, referring to FIGS. 3 and 4, the patterns 20b can be formed on the base substrate 10b of the semiconductor device according to the second embodiment by forming the grooves on the base substrate 10b. That is, the patterns 10b are formed by forming the grooves on the base substrate 10b.

In addition, the pattern 20b may have the elliptic shape, the rectangular shape or the triangular shape. In detail, the groove formed on the base substrate 10b may have the elliptic shape, the rectangular shape or the triangular shape.

The interval between the patterns 20b may be 100 nm or less. Preferably, the interval between the patterns 20b is in the range of 10 nm to 100 nm. In addition, the pattern 20b may have a depth of about 5 nm or above. Preferably, the pattern 20b may have a depth in the range of 5 nm to 1000 nm, but the embodiment is not limited thereto. The shape and the size of the patterns 20b and the interval between the patterns 20b may vary depending on the distribution of defects in the base substrate 10b.

The base substrates 10a and 10b comprising silicon carbide may have various defects, such as a defect created in a basal plane of a lattice, a defect caused by the tilting of the lattice, and a defect created on a surface of the base substrates 10a and 10b. These defects may exert bad influence upon the semiconductor device when the epitaxial layers 30a and 30b are grown. In addition, these defects may exert bad influence upon the operation of a switching device.

In particular, the base substrates comprising silicon carbide may have the basal plane dislocation (BPD). Since the BPD exerts great influence upon the reliability of the semiconductor device, it is very important to reduce the BPD.

According to the related art, a buffer layer is formed on the base substrate and the epitaxial layer is formed on the buffer layer in order to reduce the BPD. That is, the crystal defect caused the lattice mismatch and difference in the thermal expansion coefficient between the base substrate and the epitaxial layer is prevented by the buffer layer. However, a patterning process, such as an additional etching process, and a regrowing process are additionally necessary to form the buffer layer.

According to the embodiment, the patterns 20a and 20b are formed on the base substrate 10a and 10b to restrain the growth of dislocation. That is, the BPD in the base substrates 10a and 10b may not grow any more by the patterns 20a and 20b. According to the embodiment, the BPD in the base substrates 10a and 10b can be reduced by 50% or more. That is, according to the embodiment, the BPD in the base substrates 10a and 10b is controlled so that the epitaxial layer having the high quality can be obtained and the high-performance device can be manufactured by preventing the growth of the dislocation when the base substrates comprise silicon carbide.

In addition, since the additional processes can be omitted, the manufacturing cost can be reduced and the quality of the substrate surface can be improved.

The epitaxial layers 30a and 30b are formed on the base substrates 10a and 10b, respectively. The epitaxial layer 30a is horizontally formed on one surface of the base substrate 10a exposed among the patterns 20a and fills gaps among the patterns 20a.

If the patterns are provided by forming the grooves on the based substrate 10b, the epitaxial layer 30b is horizontally formed on one surface of the base substrate 10b exposed among the patterns 20b and fills gaps among the patterns 20b.

The dislocation propagated to the epitaxial layers 30a and 30b can be reduced by the patterns 20a and 20b, so that the leakage current caused by the crystal defect can be significantly reduced.

Hereinafter, the method for growing the semiconductor crystal according to the first and second embodiments will be described in detail with reference to FIGS. 5 to 19. For the purpose of clarity, the description about the elements and structures that have been described above will be omitted.

FIGS. 5 to 10 are sectional views showing the method for growing the semiconductor crystal according to the first embodiment. FIGS. 11 to 19 are sectional views showing the method for growing the semiconductor crystal according to the second embodiment.

The method for growing the semiconductor crystal according to the first and second embodiments comprises the steps of cleaning a silicon carbide substrate, forming a pattern and forming an epitaxial layer. The first and second embodiments may be distinguished from each other according to the step of forming the patterns 20a and 20b.

In the step of cleaning the base substrates 10a and 10b, the surfaces of the silicon carbide substrates are cleaned.

Hereinafter, the step of forming the patterns 20a and 20b in the method for growing the semiconductor crystal according to the first and second embodiment will be described.

Referring to FIGS. 4 to 9, according to the method for growing the semiconductor crystal of the first embodiment, the pattern 20a is formed on the surface of the base substrate 10a in the step of forming the pattern 20a. The pattern 20a can be formed by using an atomic force microscope (AFM) 100.

In general, the AFM 100 is an apparatus for obtaining atomic level 3-D surface images and is used for imaging the surface of the substrate without causing damage to the substrate. The AFM 100 can recognize the surface structure of the substrate in the unit of nano-scale by using the interaction (electric and magnetic stimulation) between the surface of the base substrate 10a and a probe 110.

Meanwhile, the nano lithography is the main application field of the AFM 100. According to the nano lithography, a proper signal is applied between the probe 110 and the base substrate 10a to apply force (electric and magnetic stimulation) corresponding to the deformation of the surface of the base substrate 10a in order to adjust the alignment of atoms and molecules on the surface of the base substrate 10a. The micro patterns 20a can be formed on the base substrate 10a through the nano lithography. When the lithography process is performed by using the AFM 100, stage driving voltage is applied to move the base substrate 10a relative to the probe 110 or to move the probe 110 of the AFM 100 relative to the base substrate 10a. Meanwhile, if lithography voltage is applied in a state that the probe 110 is relatively moved on the substrate or the probe 110 of the AFM 100 is moved relative to the substrate, the electric field or the magnetic field is generated between the probe 110 and the substrate surface, so that the force (electric and magnetic stimulation) is applied to the substrate surface in a contact manner or a non-contact manner. As a result, the substrate surface is physically/chemically deformed so that the patterns 20a can be formed.

Based on the above principle, the patterns 20a can be readily formed by using the AFM 100. At this time, voltage in the range of 6V to 20V can be applied between the probe 110 and the base substrate 10a, that is, the silicon carbide substrate, but the embodiment is not limited thereto. Various voltages can be applied according to the distribution of the defects in the silicon carbide substrate to form the patterns 20a.

In addition, the patterns 20a can be formed in the humidity condition of 30% or above. If the dry condition is maintained due to the low humidity, the shape of the patterns 20a may be deformed so that the patterns 20a having the long axis of 10 nm to 100 nm and the height of 100 nm or less may not be formed. The step of forming the patterns 20a can be performed in the normal temperature.

The shape of the patterns 20a may vary depending on the type of the probe 110. Thus, various probes 110 can be used depending on the shape of the patterns 20a to be formed.

Since the AFM 100 is used in the step of forming the patterns 20a, the micro patterns 20a can be readily formed, so that the manufacturing cost can be reduced.

Referring to FIGS. 11 to 19, according to the method for growing the semiconductor crystal of the second embodiment, the patterns 20b can be formed on the surface of the base substrate 10b, that is, the silicon carbide substrate. According to the second embodiment, the step of forming the patterns 20b comprises the steps of forming an oxide layer pattern on the base substrate 10b and removing the oxide layer pattern from the base substrate 10b.

The step of forming the oxide layer pattern on the silicon carbide substrate can be performed by using the AFM 100.

At this time, as the oxide layer pattern is formed on the substrate, an oxide layer may be formed under the surface of the substrate where the oxide layer pattern is formed. That is, the oxide layer pattern may protrude from the surface of the substrate and a pattern having the shape the same as that of the oxide layer pattern may be formed under the substrate where the oxide layer pattern is formed, which is called consume property. Due to the consume property, the pattern having the shape the same as that of the oxide layer pattern, which protrudes from the surface of the substrate, may be formed under the surface of the substrate at the depth corresponding to 50% of the height of the oxide layer pattern formed on the substrate.

For instance, when the oxide layer pattern having the triangular shape and the height in the range of 10 nm to 2000 nm is formed on the substrate by the AFM, the pattern having the triangular shape and the depth in the range of 5 nm to 1000 nm, which is 50% of the height of the oxide layer pattern, can be formed under the substrate.

Then, in the step of removing the oxide layer pattern from the substrate, a wet etching process is performed by using HF solution to remove the oxide layer pattern. That is, the oxide layer protruding from the substrate and the oxide layer formed under the substrate are simultaneously removed, so that the grooves are formed under the substrate, thereby forming the patterns 20b.

Based on the above principle, the oxide layer pattern can be formed or removed by using the AFM 100, so that the patterns 20b can be formed on the substrate. At this time, voltage in the range of 2V to 25V can be applied between the silicon carbide substrate 10b and the probe 110. Preferably, voltage in the range of 6V to 14V can be applied between the silicon carbide substrate 10b and the probe 110. However, the embodiment is not limited thereto and various voltages can be applied according to the distribution of the defects in the substrate to form the patterns 20b.

In addition, the patterns 20b can be formed in the humidity condition of 40% to 90%. If the dry condition is maintained due to the low humidity, the shape of the patterns 20b may be deformed so that the patterns 20a having the interval of 100 nm or less and the depth of 5 nm or above may not be formed. The step of forming the patterns 20b can be performed in the normal temperature.

The shape of the patterns 20b may vary depending on the type of the probe 110. Thus, various probes 110 can be used depending on the shape of the patterns 20b to be formed.

Since the AFM 100 is used in the step of forming the patterns 20b and the oxide layer pattern is removed by using the HF solution, the micro patterns 20b can be readily formed on the substrate, so that the manufacturing cost can be reduced.

Referring to FIGS. 6 to 8 and 14 to 17, the method comprises the step of forming the epitaxial layers 30a and 30b. The epitaxial layers 30a and 30b can be formed on the silicon carbide substrates 10a and 10b. The epitaxial layers 30a and 30b can be formed on the silicon carbide substrates 10a and 10b exposed among the patterns 20a and 20b.

Although not shown in the drawings, a channel area (not shown) can be formed by implanting impurities into the epitaxial layers 30a and 30b.

The epitaxial layers 30a and 30b can be formed through the epitaxial lateral over growth (ELOG). The ELOG can be achieved through the metal organic chemical vapor deposition (MOCVD) or molecular beam epitaxy (MBE). According to the MOCVD, vapor of metal organic compound having the high vapor pressure is applied to the surface of the substrate heated in a chamber to grow the thin film on the substrate. The MOCVD can reduce the process time due to the high deposition rate. According to the MBE, various growth materials are deposited on the substrate in the form of molecules. The MBE can improve the product quality although the growth rate is low. However, the embodiment is not limited thereto, and the epitaxial layers 30a and 30b can be formed through various growth schemes.

Although not shown in the drawings, a thick-film type semiconductor growth layer can be further formed on the epitaxial layers 30a and 30b.

The method for growing the semiconductor crystal according to the embodiment can omit the additional processes to form the buffer layer that restrains the growth of defects. Thus, the damage to the substrate surface can be reduced, so that the crystallinity of the semiconductor layer can be improved. Thus, the semiconductor layer having the high reliability and superior quality can be formed.

Hereinafter, the structure of a vertical type semiconductor device and a horizontal type semiconductor device will be described in detail with reference to FIGS. 9, 10, 18 and 19. FIGS. 9, 10, 18 and 19 are sectional views of the semiconductor device.

Figure 9:
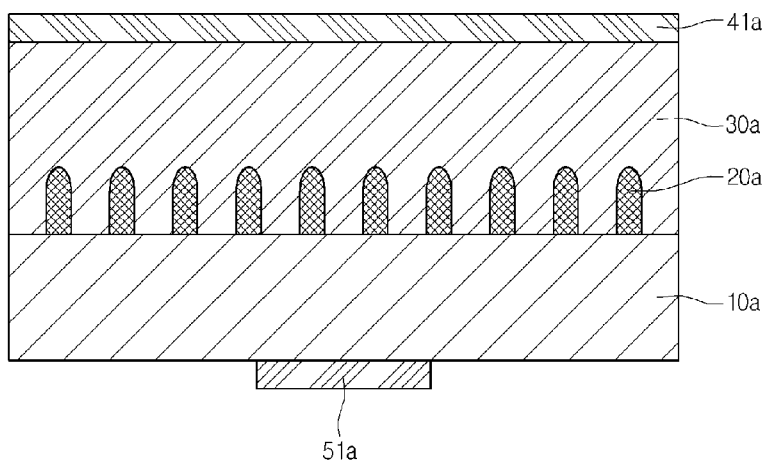
Figure 18:
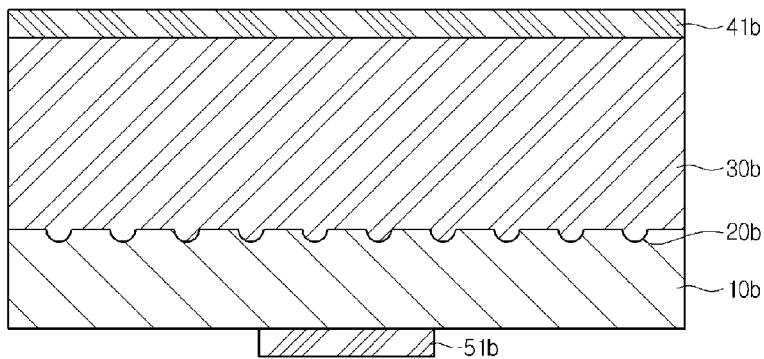

As shown in FIGS. 9 and 18, electrodes 41a, 41b, 51a and 51b are formed on bottom surfaces of the substrates 10a and 10b and top surfaces of the epitaxial layers 30a and 30b.

The electrodes 41a, 41b, 51a and 51b may comprise at least one of Ag, Cu, Ni, Al, Zn or an alloy thereof and can be formed through the vacuum deposition process.

Figure 10:
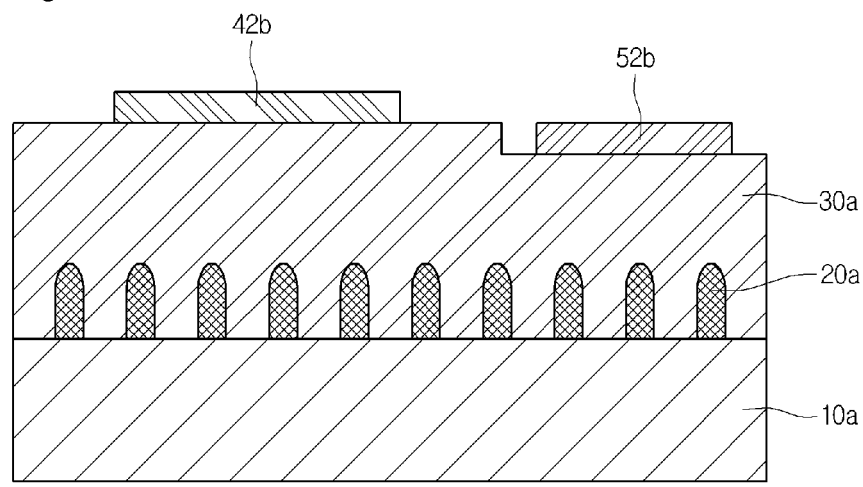
Figure 11:
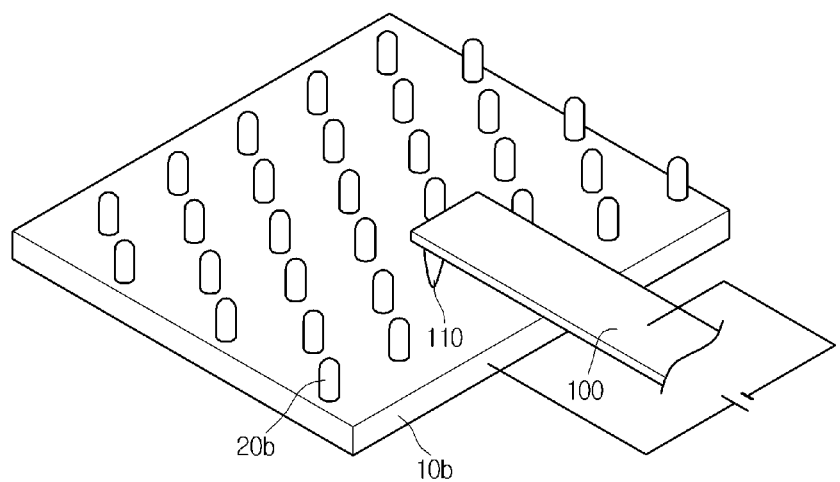
FIGS. 11 to 19 are sectional views showing a method for growing a semiconductor crystal according to the second embodiment.
Figure 12:
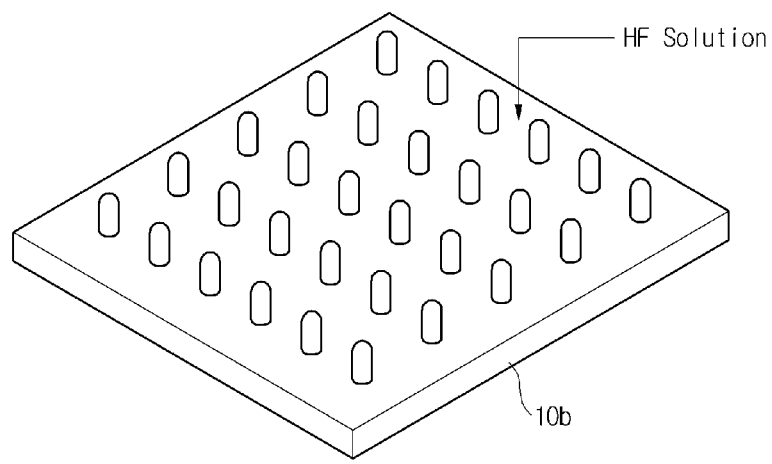
Figure 13:
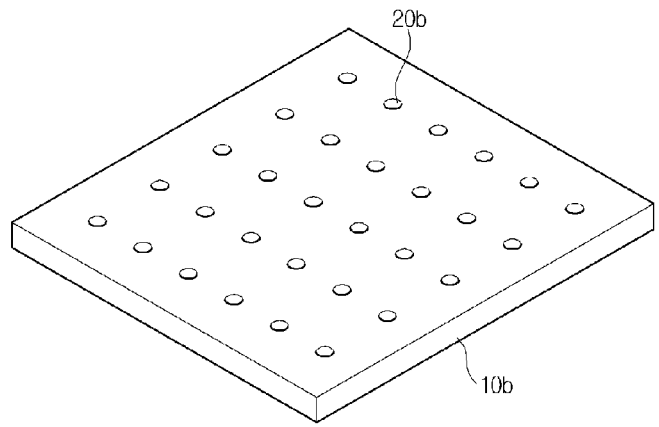
Figure 14:
Figure 15:
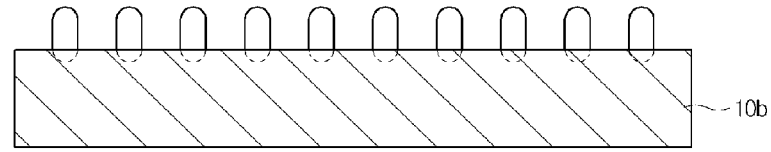
Figure 16:
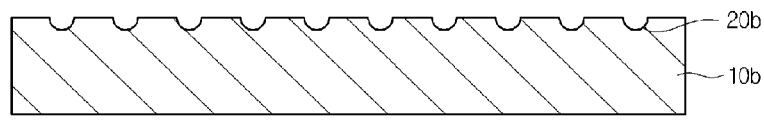
Figure 17:
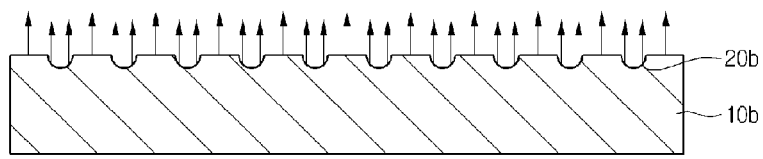
Figure 19:
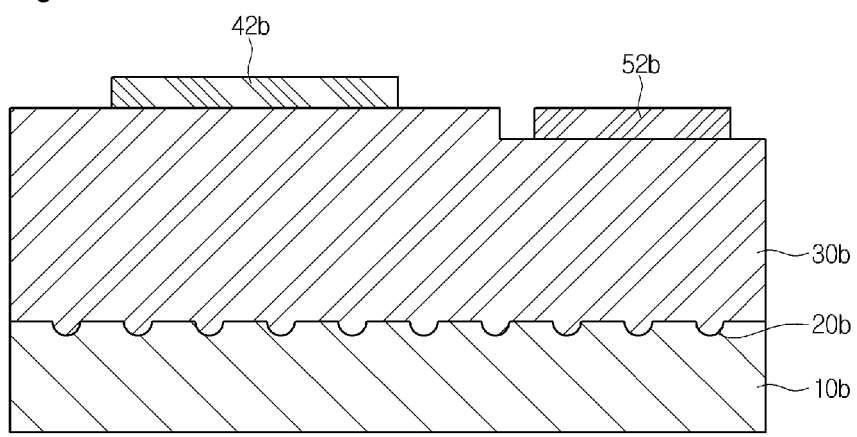

The semiconductor device shown in FIGS. 10 and 19 is the horizontal type semiconductor device.

Referring to FIGS. 10 and 19, electrodes 42a, 42b, 52a and 52b are formed on the epitaxial layers 30a and 30b. The electrodes 42a, 42b, 52a and 52b are almost horizontally arranged on the top surfaces of the epitaxial layers 30a and 30b.

However, the embodiment is not limited to the above, but various methods for growing the semiconductor crystal can be employed in various semiconductor devices.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A semiconductor device comprising:
a base substrate;
patterns on the base substrate;
an epitaxial layer on the base substrate;
wherein the base substrate and the epitaxial layer comprise the same material,
wherein the base substrate and the epitaxial layer comprise SiC having the same crystal structure,
wherein the patterns protrude vertically from the base substrate,
wherein a height of each pattern is greater than twice a diameter of a bottom surface of that pattern, and
wherein the epitaxial layer is formed through epitaxial lateral over growth (ELOG).

2. The semiconductor device of claim 1, wherein the epitaxial layer is horizontally formed on one surface of the base substrate exposed among the patterns and fills gaps among the patterns.

3. The semiconductor device of claim 1, wherein the patterns have an elliptic cone shape with a long axis length in a range of 10 nm to 300 nm and a height of 100 nm or less.

4. The semiconductor device of claim 1, wherein the protruding patterns comprise silicon oxide.

5. The semiconductor device of claim 1, wherein the protruding patterns comprise carbon oxide.

6. A semiconductor device comprising:
a base substrate including patterns;
an epitaxial layer on the base substrate;
wherein the base substrate and the epitaxial layer comprise the same material,
wherein the base substrate and the epitaxial layer comprise SiC having the same crystal structure,
wherein the patterns include a concave groove that is vertically oriented from the base substrate,
wherein an interior of the concave groove is filled with SiC, and
wherein the epitaxial layer is formed through epitaxial lateral over growth (ELOG).

7. The semiconductor device of claim 6, wherein the patterns have an elliptic shape, a rectangular shape, or a triangular shape.

8. The semiconductor device of claim 6, wherein an interval between the patterns is in a range of 10 nm to 100 nm.

9. The semiconductor device of claim 6, wherein each groove has a depth in a range of 5 nm to 1000 nm.

* * * * *